United States Patent

Desrosiers et al.

[11] Patent Number: 6,140,946
[45] Date of Patent: Oct. 31, 2000

[54] ASYNCHRONOUS SERIALIZATION/DESERIALIZATION SYSTEM AND METHOD

[75] Inventors: Bernard Desrosiers, Boissise le Roi; Pascal Henri Rene Marie Legras, Saint Fargeau Ponthierry, both of France

[73] Assignee: International Business Machines Corporation, Armonk, N.Y.

[21] Appl. No.: 09/096,934

[22] Filed: Jun. 12, 1998

[30] Foreign Application Priority Data

Nov. 7, 1997 [EP] European Pat. Off. .............. 97480076

[51] Int. Cl.⁷ ............................. H03M 9/00; G06F 13/00
[52] U.S. Cl. ............................................. 341/100; 395/891
[58] Field of Search ................................... 341/100, 101; 395/891, 885, 872, 873

[56] References Cited

U.S. PATENT DOCUMENTS

| | | | |
|---|---|---|---|
| 4,759,014 | 7/1988 | Decker et al. ............................. | 370/84 |
| 4,907,186 | 3/1990 | Racey ....................................... | 364/900 |
| 5,175,819 | 12/1992 | Le Ngoec et al. ........................ | 395/250 |
| 5,228,129 | 7/1993 | Bryant et al. ............................. | 395/325 |
| 5,442,914 | 8/1995 | Otsuka ...................................... | 60/527 |
| 5,487,092 | 1/1996 | Finney et al. ............................. | 375/354 |
| 5,499,338 | 3/1996 | Gercekci et al. ................... | 395/183.01 |
| 5,517,672 | 5/1996 | Reussner et al. ......................... | 395/872 |
| 5,548,628 | 8/1996 | Eggleston et al. ....................... | 378/125 |
| 5,564,027 | 10/1996 | Bui et al. ................................... | 395/309 |
| 5,587,953 | 12/1996 | Chung ....................................... | 365/220 |
| 5,592,518 | 1/1997 | Davis et al. .............................. | 375/368 |
| 5,636,176 | 6/1997 | Hashimoto et al. ..................... | 365/223 |
| 5,652,848 | 7/1997 | Bui et al. .................................. | 395/309 |
| 5,680,358 | 10/1997 | Hashimoto et al. ..................... | 365/221 |

*Primary Examiner*—Howard L. Williams
*Assistant Examiner*—Peguy Jean Pierre
*Attorney, Agent, or Firm*—John D. Flynn; Morgan & Finnegan

[57] ABSTRACT

A parallel to serial conversion circuit is disclosed. The circuit is used for converting parallel bits representing a plurality of words into serial bits. The circuit consists of storing means which comprises a plurality of word locations for temporarily storing the plurality of words at a parallel clock rate, and serialization means connected to the storing means for converting the parallel bits into serial bits at a serial clock rate. Each of the plurality of word locations is organized as a plurality of cells for storing each, one bit. Moreover the serialization means comprises parallel pointing means connected to the storing means for pointing to the plurality of words locations synchronously to the parallel clock, and serial pointing means also connected to the storing means for pointing to the plurality of cells synchronously to the serial clock. Filling indicator means are connected both to the parallel pointing means and to the serial pointing means for generating a status signal indicating the status empty or full of the storing means such that the serial pointing means is responsive to the status signal for successively pointing to the plurality of cells when the status is full.

24 Claims, 14 Drawing Sheets

ASYNCHRONOUS SERIALIZATION/ DESERIALIZATION SYSTEM AND METHOD

BACKGROUND OF THE INVENTION

1. Technical field

The present invention relates to network handling systems and more particularly to a method and a system for asynchronously serializing or deserializing data.

2. Description of prior art

There are many network handling systems in the prior art which transmit data between a processor system and a peripheral device across a serial data transmission link. Generally these network handling systems use network device interfacing the processor bus and the serial link in which various adaptations are performed like parallel to series data conversion with clocks resynchronization mechanism. Among those systems are the following patents which disclose some network devices.

U.S. Pat. No. 5,422,914 from Snyder, discloses a data synchronization system for synchronizing data communication between two devices operating at different clock frequencies, the first frequency being greater than the second frequency in an integer ratio. The system has control circuitry, first circuitry and second circuitry for generating several fractional portions of the slowest clock period, these portions representing a corresponding state of a finite state machine. This system operates with a ratio of the clock frequencies which may be expressed as N/M in simplest form where N and M are integers.

In other known systems, the frequency of the receiver device is not as in the previous cited patent necessarily synchronized to the frequency of the emitter device to transfer the data. For example U.S. Pat. No. 4,907,186 from Racey discloses an electronic interface circuit for receiving high speed serial data and converting to parallel data, by providing an input interface, a serial to parallel data converter a FIFO buffer memory and an output interface. A control circuit receives a synchronous clock signal from the data source and derives therefrom a plurality of clocking signals to clock the serial data. Whereas in this system the emitter and the receiver clocks are independent for transferring the data, the operating range of these clocks is limited by the control circuit which generates the derived serial clocks.

The circuits of these references are not acceptable for present day advanced networking applications, wherein the serial frequency may vary in a wide operating range comprising the parallel frequency. Moreover, none of the known systems offers an efficient solution to network handling systems wherein the parallel and the serial frequencies are asynchronous while these values are either equal or in close range.

In this configuration different drawbacks may arise. A first one is the well-known metastability problem which may occur on the resynchronization circuit because the serial clock may be sampled to the parallel clock on an edge transition of the serial clock, and therefore the set-up and hold times may be violated. A second problem occurs when the parallel/serial ratio between the two clocks are in the close range of the unit. In that case, sampling edges may be lost which results in lost data.

Accordingly, it would be desirable to be able to provide a new network device to avoid the aforementioned problems.

SUMMARY OF THE INVENTION

It is an object of this invention to provide an asynchronous conversion circuit.

Another object is an asynchronous conversion circuit for converting a plurality of parallel bits into serial bits and vice versa.

Another object is an asynchronous conversion circuit including a storage means for handling serial bits from a serial link and parallel bits from a processor independent of the clock rates for the parallel bits and serial bits.

Another object is a method for asynchronous data conversion of parallel bits from a processor and serial bits from a serial link and vice-a-versa.

This object is achieved by employing a parallel to serial conversion circuit for converting parallel bits representing a plurality of words into serial bits. The circuit consists of storing means which comprises a plurality of word locations for temporarily storing the plurality of words at a parallel clock rate, and serialization means connected to the storing means for converting the parallel bits into serial bits at a serial clock rate.

In a preferred embodiment, each of the plurality of word locations is organized as a plurality of cells for storing each, one bit. Moreover the serialization means comprises parallel pointing means connected to the storing means for pointing to the plurality of words locations synchronously to the parallel clock, and serial pointing means also connected to the storing means for pointing to the plurality of cells synchronously to the serial clock. Filling indicator means are connected both to the parallel pointing means and to the serial pointing means for generating a status signal indicating the status empty or full of the storing means such that the serial pointing means is responsive to the status signal for successively pointing to the plurality of cells when the status is full.

In another embodiment, the serial pointing means comprises a plurality of cell pointing circuits responsive to the filling indicator means and being connected in series, the last one being ring connected to the first one. The output of each cell pointing circuit is connected to a corresponding cell within the storing means.

In yet another embodiment, the filling indicator means comprises a plurality of filling indicator circuits for generating a plurality of status signals, such that a group of successive cell pointing circuits is responsive to a corresponding status signal.

In yet another embodiment, the parallel pointing means comprises a plurality of word pointing circuits, each being responsive to a status signal. The word pointing circuits are connected in series, the last one being ring connected to the first one. Moreover the output of each is connected to a corresponding word location within the plurality of word locations.

In a specific embodiment, the conversion circuit is used in an interface device connecting a processor bus operating at a processor clock rate to a serial link operating at a serial clock rate, wherein the words are in the form of data words.

The circuit is advantageously operating when the serial clock is asynchronous to the parallel clock, or when the ratio of the parallel/serial clock rates is equal 1.

Moreover, the system of the invention may apply either to parallel/serial transfer mode or to serial/parallel transfer mode as well as to serial/serial transfer mode.

DETAILED DESCRIPTION OF THE INVENTION

Figure 1:
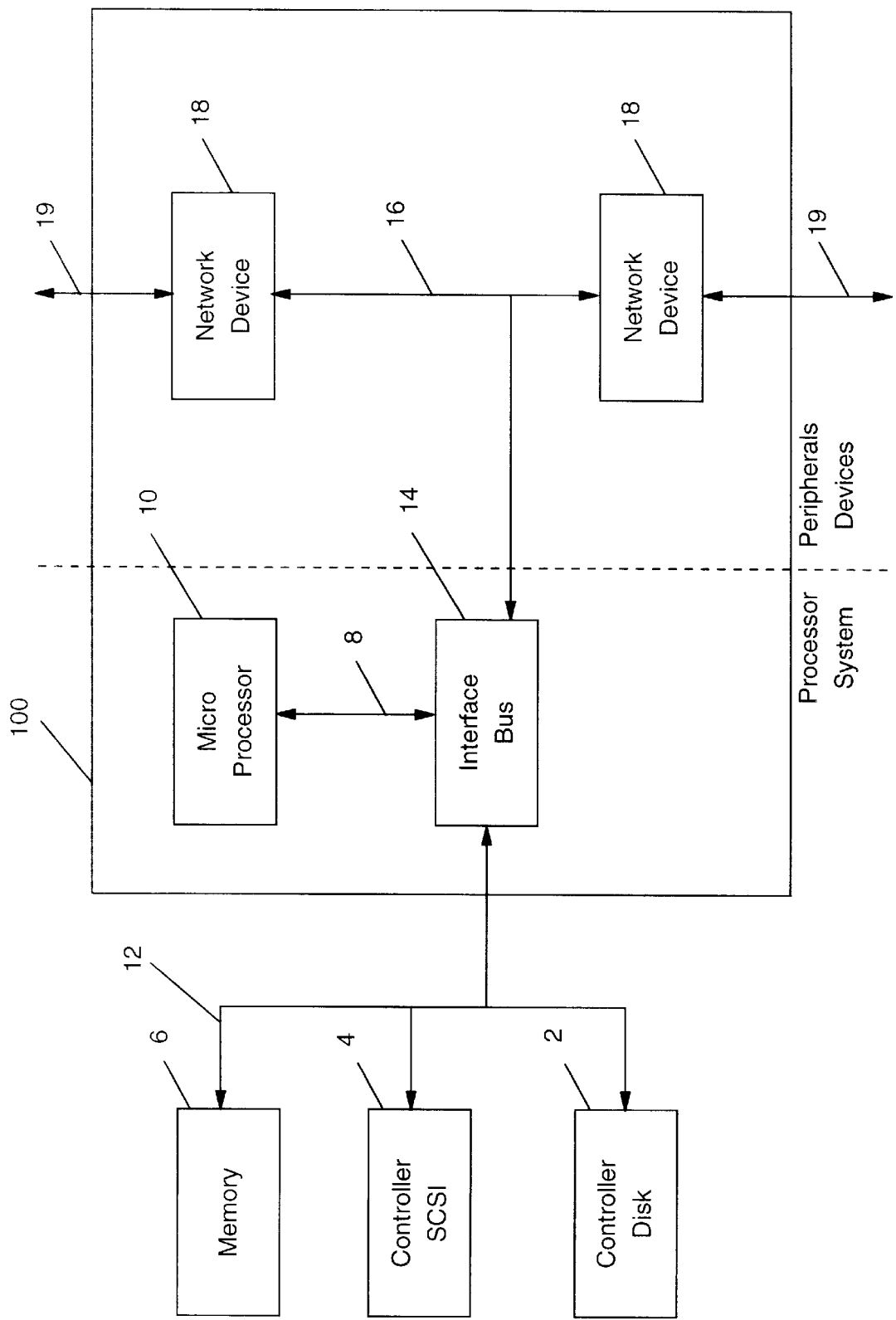
FIG. 1 is a block diagram of a typical prior art implementation of a network device as used in data transfer.

Referring now to the drawings, and more particularly to FIG. 1, a network handling system is shown, comprising a network device 100 connected to storage devices 2, 4, and 6 via a memory bus 12. The network device 100 comprises a bus controller 14, a micro-controller core 10 and interface devices 18. The bus controller 14 is connected to the micro-controller core 10 via a processor bus 8, and to the interface devices 18 via an internal bus 16. Each interface device 18 is connected to a serial link 19. Various types of networks (not shown) such as the so-called Universal Asynchronous Receive Transmit Device (UART) or Local Area Network (LAN) or Wide Area Network (WAN) may be connected to the serial link 19. Typical storage devices 2, 4, and 6 may be Static memories (SRAM), Dynamic memories (DRAM) or SCSI controllers.

The bus controller 14 provides the bus-to-bus interface mechanism between memory bus 12 and the internal bus 16. The transfer operations are managed by micro-controller core 10 which fetches instruction codes from storage devices 2, 4, and 6. Also attached to network device 100 is a control bus (not shown) to manage the memory bus protocol. The interface device 18 comprises the serialization and the deserialization circuitry and complementary hardware to sequence and format the protocol of the serial link. The interface device 18 receives parallel data in the form of strings of data bits (indifferently called data words) to convert them into serial data on serial link 19, or receives serial data to convert them into parallel data on internal bus 16. The memory bus 12 and the internal bus 16 operate on a processor clock PCLK. The serial link 19 operates on a serial clock SCLK.

Figure 2A:
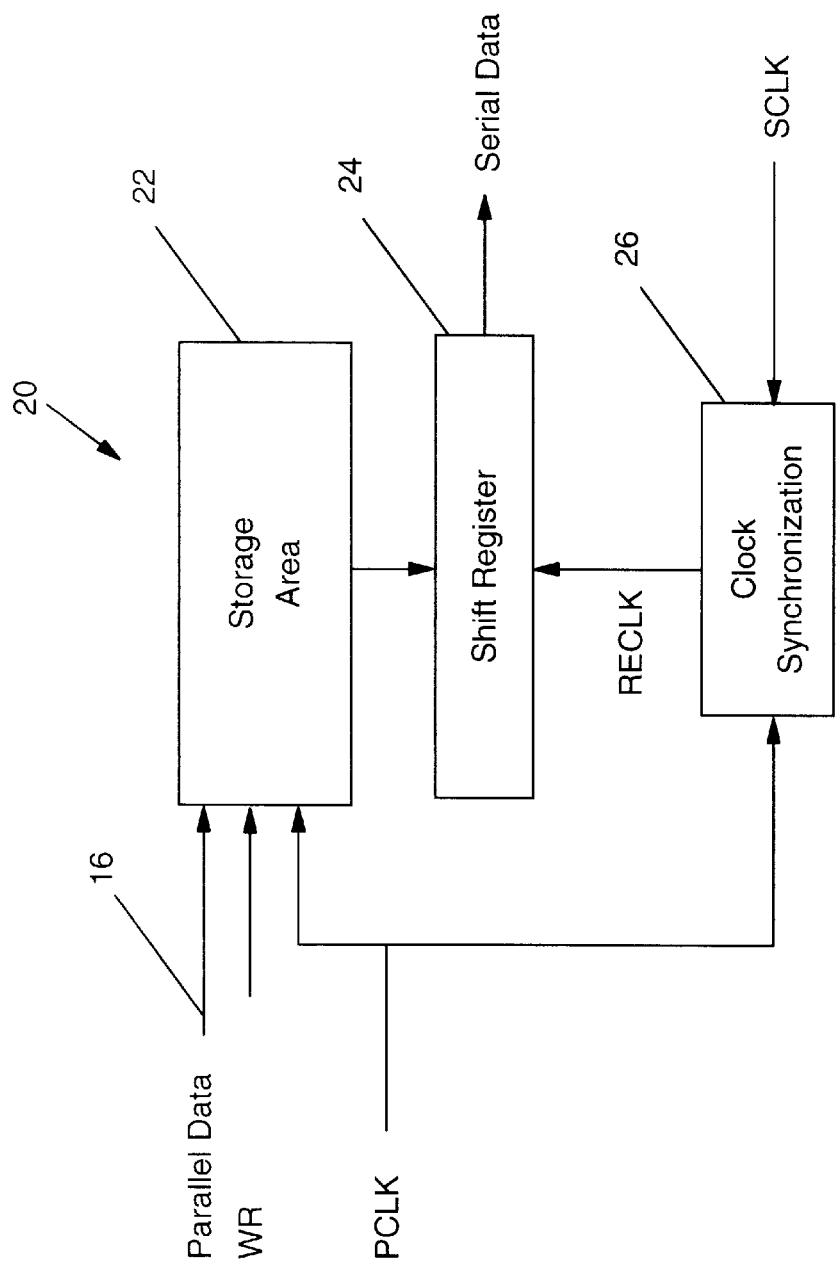
FIG. 2A is a block diagram of an interface device as used in a network device of FIG. 1.

FIG. 2A is a block diagram illustrating a typical data conversion circuit 20 which in part forms the interface device 18. A storage area 22 is connected to conventional shift register 24. A clock synchronization device 26 is connected to the shift register 24. The storage area is capable of storing a plurality of data words, each data word being stored into a string location within the storage area. A write control signal WR which is synchronous to the processor clock PCLK controls the loading of data words. In various embodiments, the storage area may be either a FIFO or a RAM. A data word which is output from the storage area is first loaded into the shift register 24 wherein a conventional bit-to-bit serialization is performed. The serial data are further output according to a resynchronized clock RECLK. The resynchronized clock RECLK is generated by the resynchronization circuit 26 which inputs both the processor clock and the serial clock. The characteristics of RECLK are that its edges are synchronized to the edges of the processor clock PCLK as illustrated in FIG. 2B.

Figure 2B:
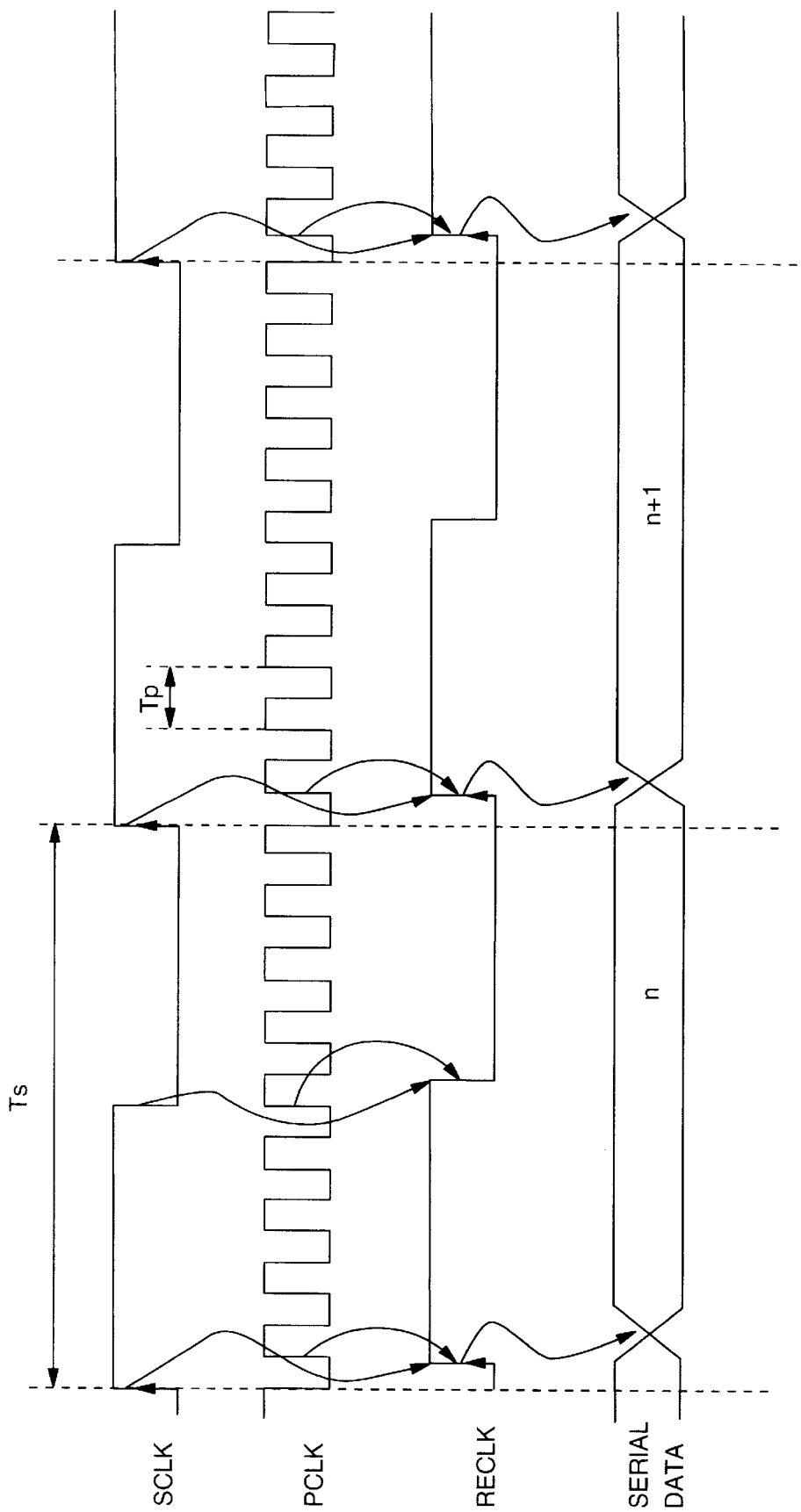
FIG. 2B is a timing diagram illustrating a transfer operation in the circuit of FIG. 2A.

Referring to FIG. 2B, a serialization cycle is illustrated through one period Ts of the serial clock SCLK with a period Tp of the processor bus such that the ratio Ts/Tp is not in a critical range as previously explained (in the example Ts/Tp is greater than 4). A low to high transition of SCLK generates a low to high transition of the resynchronized clock RECLK immediately after the first low to high transition of the processor clock PCLK. A high to low transition of SCLK generates a high to low transition of the resynchronized clock RECLK immediately after the first low to high transition of the processor clock PCLK. Therefore, the average frequency of RECLK is equal to the frequency of SCLK, thereby maintaining the data rate on the serial link.

Figure 3A:
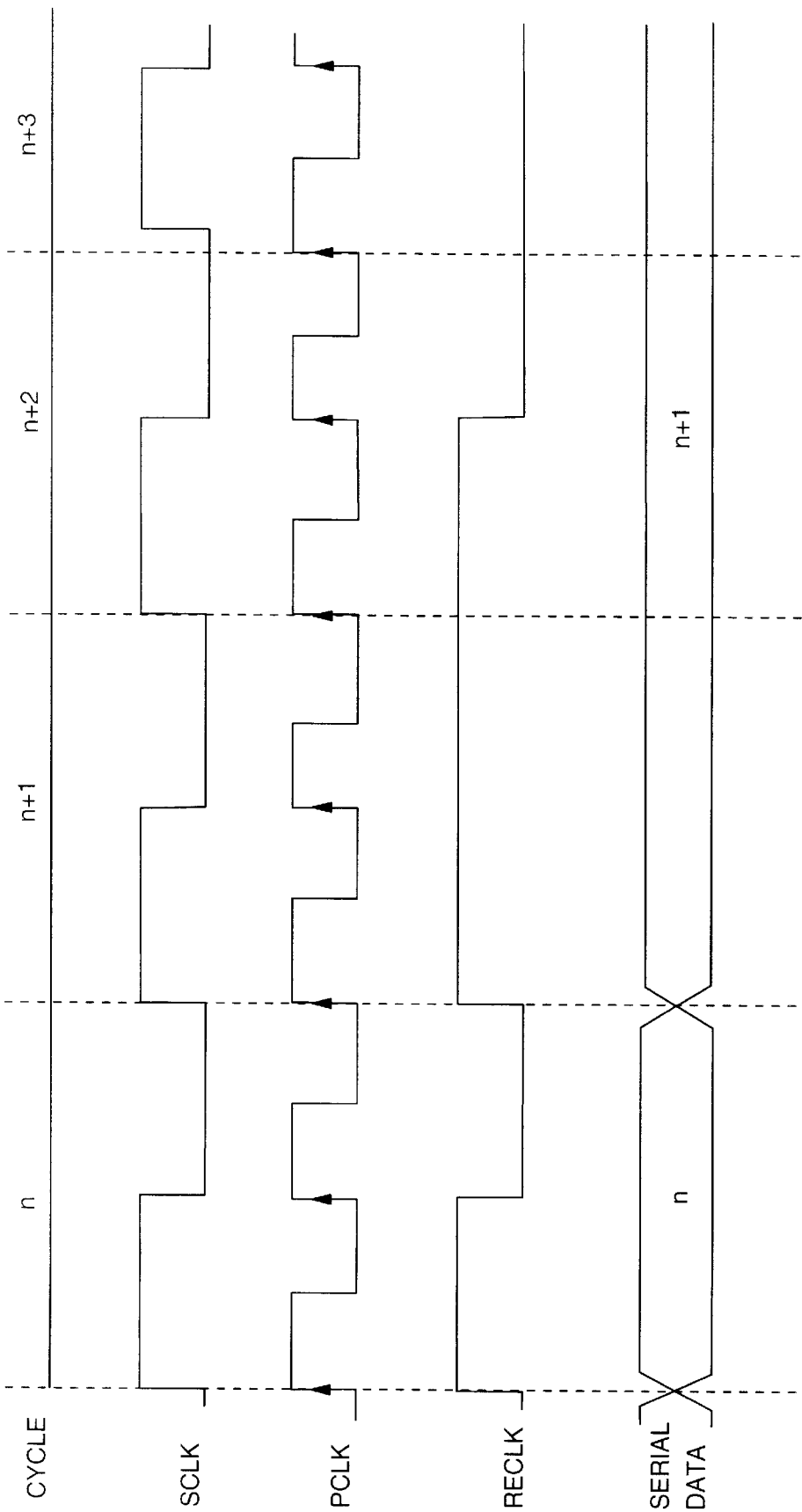
FIG. 3A to 3C are timing diagrams for illustrating different parallel/serial frequency ratios.
Figure 3B:
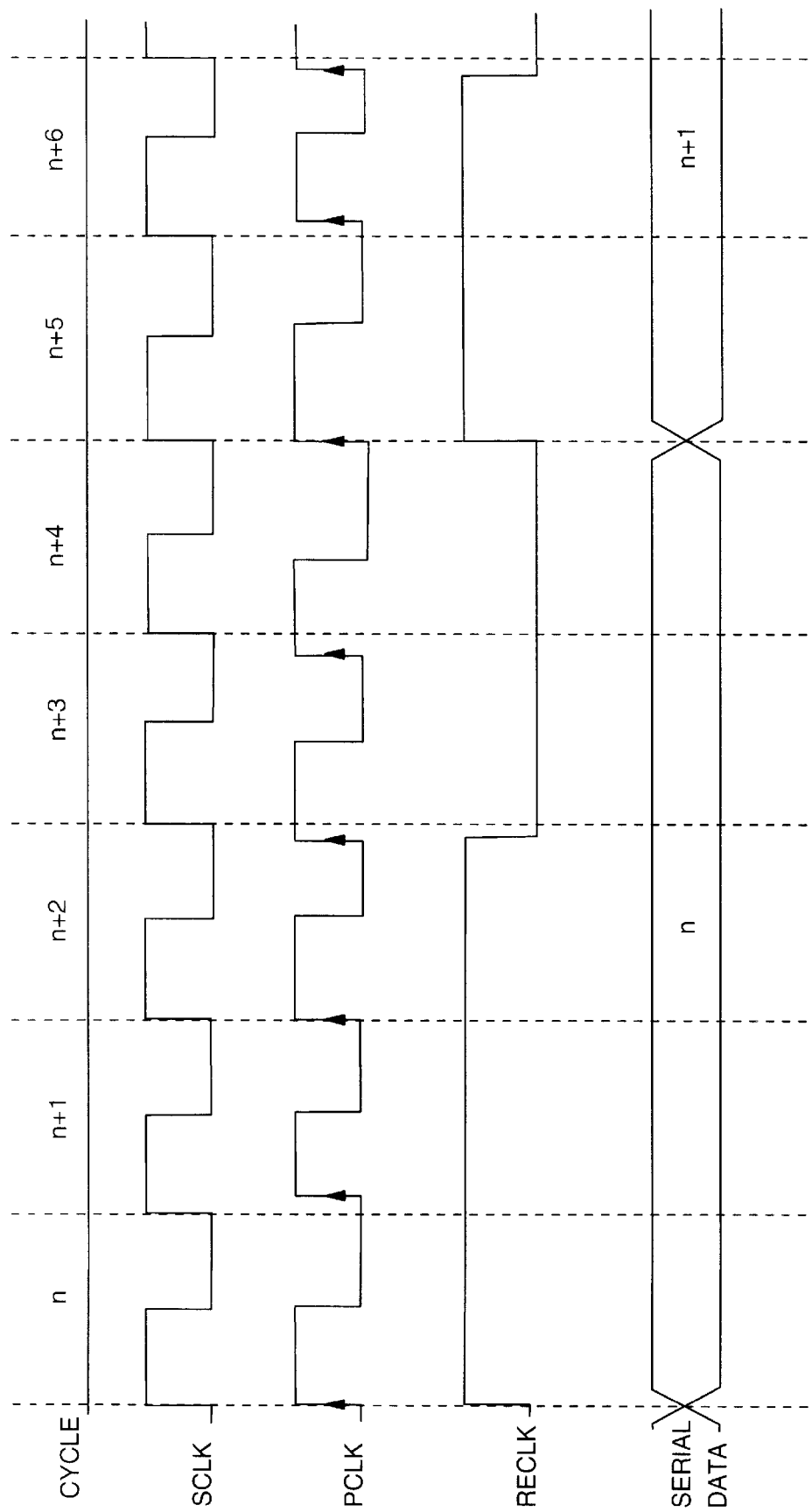
Figure 3C:
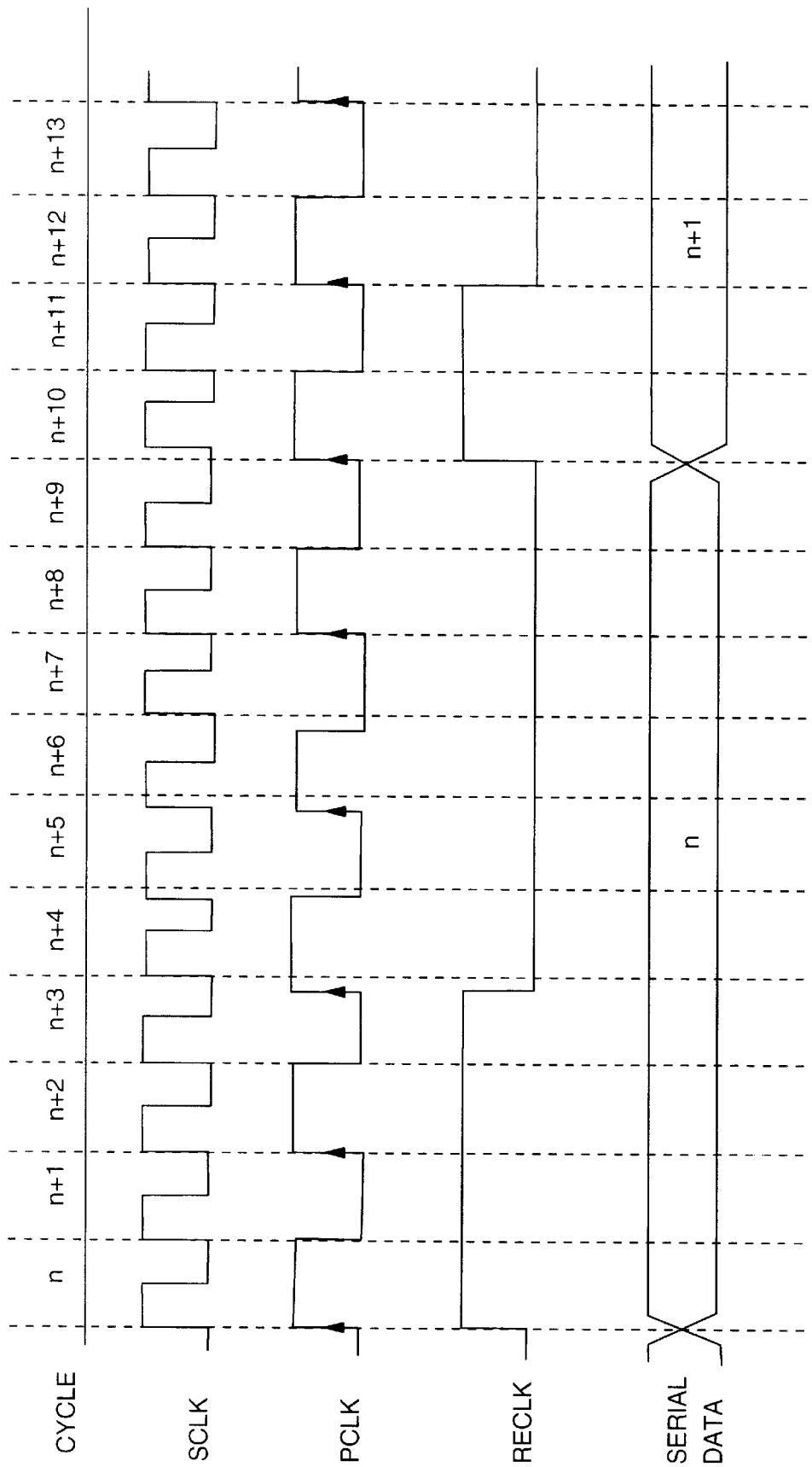

FIGS. 3A to 3C illustrate several timing diagrams of the parallel and the serial clocks for different frequency ratios where the resynchronization clock is not efficient. In FIG. 3A, the serial frequency Fs is half the parallel frequency Fp. In FIG. 3B the serial frequency Fs equals the parallel frequency Fp and there is a jitter on the parallel clock. Finally, in FIG. 3C the serial frequency is twice the parallel frequency. It is clearly understood by the skilled person that these waveforms exemplify cases where a transition of the serial clock may not necessarily generate a transition of the resynchronized clock, due to the well-known jitter phenomena but also in the case when the duration of the high level of SCLK is not equal to the duration of the low level of SCLK. It is clearly understood that if an edge of RECLK is not generated, a disturbance in the data provided on the serial link appears.

Figure 4:
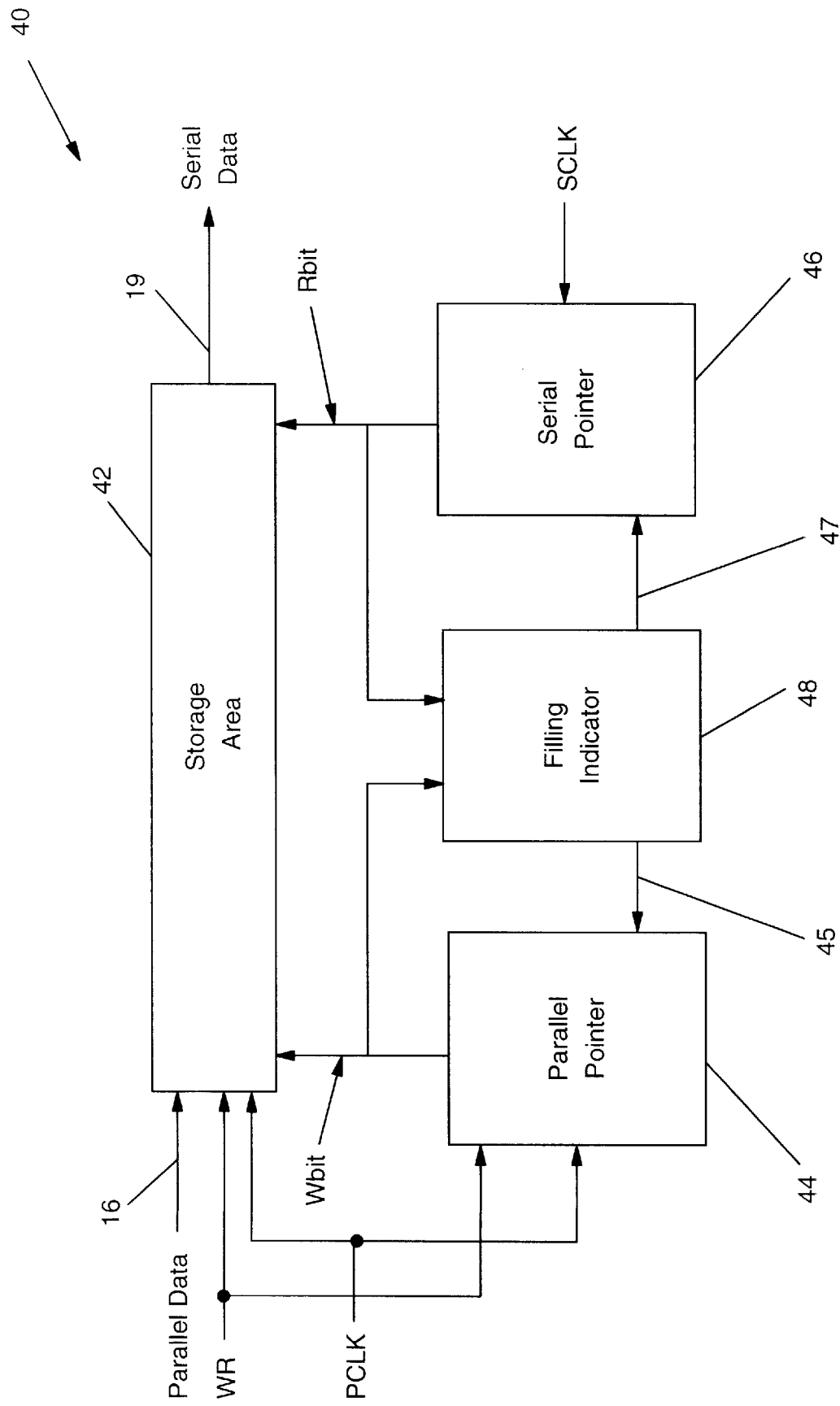
FIG. 4 is a block diagram of an interface device incorporating the principles of the present invention.

Referring now to FIG. 4, a data conversion circuit 40 as used in the invention is first described in the case of a parallel/serial data transfer. The conversion circuit comprises a storage area 42, a parallel pointer generator 44, a serial pointer generator 46 and a filling indicator generator 48. The processor clock PCLK and the internal bus 16 are conventionally connected to inputs of the storage area 42. Serial data are directly output from the storage area on the serial data link 19. The parallel pointer generator 44 receives the processor clock signal PCLK and the write control WR. The parallel pointer generator 44 is also connected through line Wbit to the storage memory 42 and to the filling indicator generator 48. The serial pointer generator 46 receives the serial clock signal SCLK, and is also connected through line Rbit to the storage memory 42 and to the filling indicator generator 48. The output of filling indicator generator 48 is connected through line 45 to the parallel pointer generator and is connected through line 47 to the serial pointer generator.

During an initialization step, the memory is emptied and the filling indicator 48 is reset. For clarity of description it is assumed that the memory is organized as a matrix of n rows by m columns and each crossing of row and column is a storage unit (or a cell) storing a data bit. The width (m) of the matrix is preferably choosen to be equal to the data word length, while the depth (n) of the matrix is choosen according to the serial data rate on the serial link and to the load and the bandwidth of the buses. In a preferred embodiment, the width is 32-bits, and the depth is equal to three rows, but the system of the invention may operate on any other organization of the memory.

The parallel pointer generator 44 points through line Wbit to the first row and the serial pointer generator points through line Rbit to the first storage unit within the first row. It is important to note that except during the initialization step, the serial pointer generator is never pointing to a storage unit within the row currently pointed by the parallel pointer generator.

When the write control signal WR is asserted, the first row pointed in the memory is loaded with a valid data word. Thereafter the parallel pointer generator 44 points to the next row, and the filling indicator signal corresponding to the first row is set to a 'full' value thereby forbidding another loading of data words into the first row. This 'full' value is maintained until the first row is later completely filled out during a serialization cycle.

Simultaneously, the serial pointer generator is informed thru line 47 of the filling of the first row, and is put in a running state to allow the first data bit of the first row to be output according to the serial clock frequency. When the last bit of the first row is output, the filling indicator signal is reset to an "empty" value, thereby allowing a new loading of a valid data word. As the loading of the memory is totally independent of the serialization operation, such loading is executed until the memory is full whatever the serialization rate is. It is therefore clearly apparent that the system of the invention operates in a completely asynchronous way.

While the parallel/serial data transfer has been described, the skilled person will easily adapt the system with minor arrangements to a serial/parallel data transfer as well as to a serial/serial data transfer.

Figure 5A:
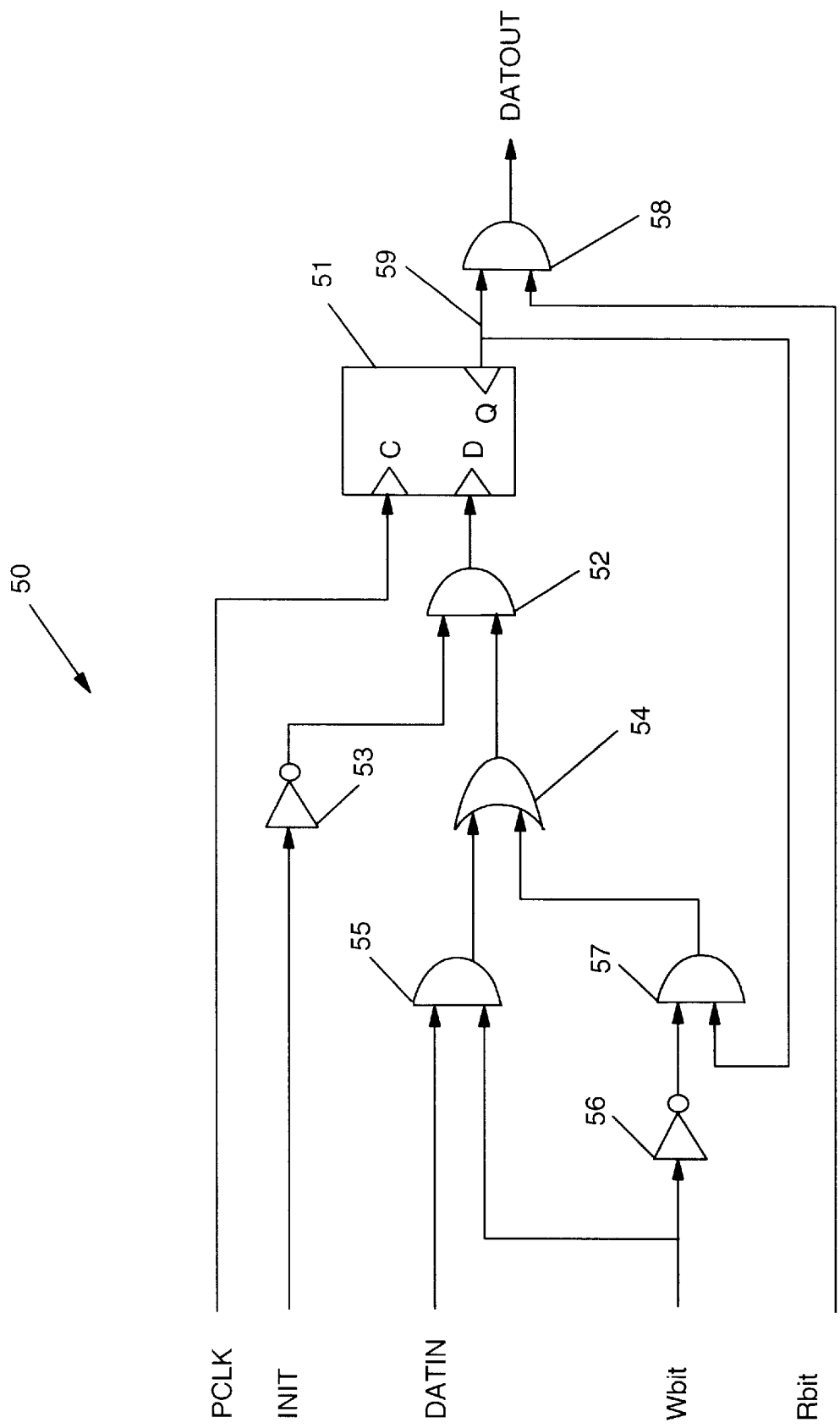
FIG. 5A is a detailed implementation of a storage unit as used in FIG. 4.

Referring to FIG. 5A, a storage unit 50 as used in the invention is comprised of a conventional flip-flop latch 51, a first AND gate 52, a first inverter 53, a first OR gate 54, a second AND gate 55, a second inverter 56, a third AND gate 57 and a fourth AND gate 58. The inverter 53 has its input connected to receive an initialization signal INIT used only during the initialization step. The inverter output is connected to one input of the AND gate 52. The second input of AND gate 52 is connected to receive the output of the OR gate 54. The output of AND gate 52 is connected to the data input D of latch 51. The other input of latch 51 is a clock input receiving the processor clock PCLK. The AND gate 55 is connected to receive on one input a data bit DATIN, and on the other input the parallel pointer output signal Wbit. The output of AND gate 55 is connected to the first input of OR gate 54. The other input of OR gate 54 is connected to receive the output of AND gate 57. The Wbit signal is also connected to the input of inverter 56 which output is connected to a first input of AND gate 57. The second input of the latter is connected to receive the output 59 of latch 51. The output 59 is also connected to a first input of AND gate 58. A second input of AND gate 58 is connected to receive the serial pointer output signal Rbit. The output DATOUT of AND gate 58 provides the value of the data bit loaded in this location.

Similarly, each storage unit provides a corresponding data output. All the data outputs within a row are ORed together through conventional logic circuit (not shown) to output one serial data bit among the data bits stored within a row. Thereafter all the row outputs are similarly ORed to provide one serial data to be output from the storage area on the serial data link.

Figure 5B:
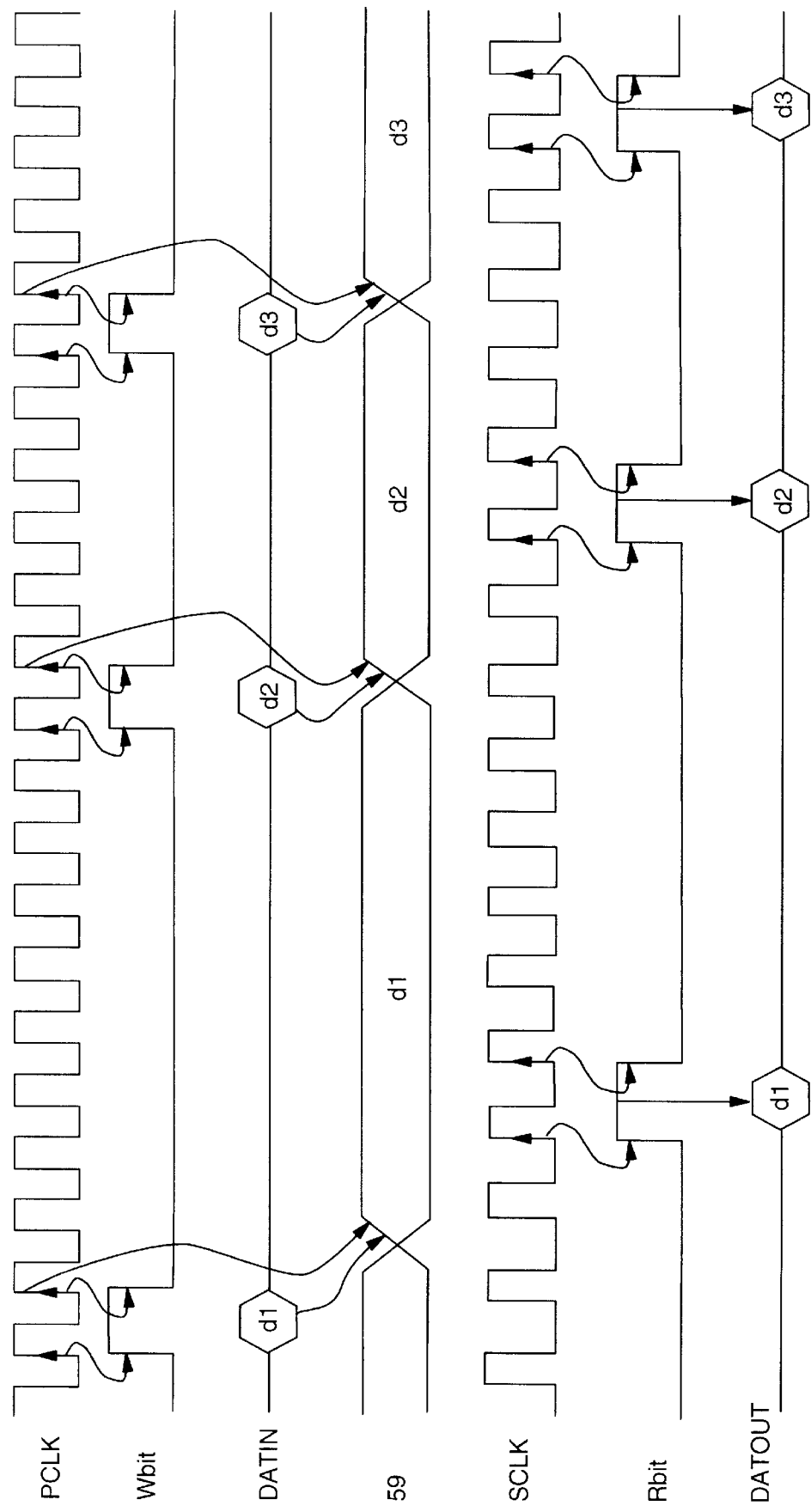
FIG. 5B illustrates the timing diagram of several signals used within a storage unit.

In order to facilitate the understanding of the operating within the storage unit, reference is now made to the timing diagram of FIG. 5B. The parallel pointer output signal Wbit is generated by the parallel pointer generator 44 in a way fully explained hereinafter. The Wbit signal is synchronous to the processor clock PCLK and is active during one cycle of PCLK in order to capture the data. After a low to high transition of Wbit, the valid data is loaded within the latch 51 of the storage unit. The output of the latch is therefore shown on line 59 as having the loaded value. This value is held until the next pulse of Wbit which will enable a new data to be loaded. The line 59 is fed back to gate 57 to hold the stored value independently of any undesirable variation on the data line. The serial pointer output signal Rbit is synchronous to the serial clock SCLK and is active during one cycle of SCLK. An assertion of Rbit allows the value held on line 59 to be output as a DATOUT through the output circuit 58. It is mandatory that a transition on the serial pointer output signal Rbit occurs only after the Wbit signal is deasserted. The generation of both Rbit and Wbit signals will be now explained with reference to FIGS. 6A and 6B.

Figure 6A:
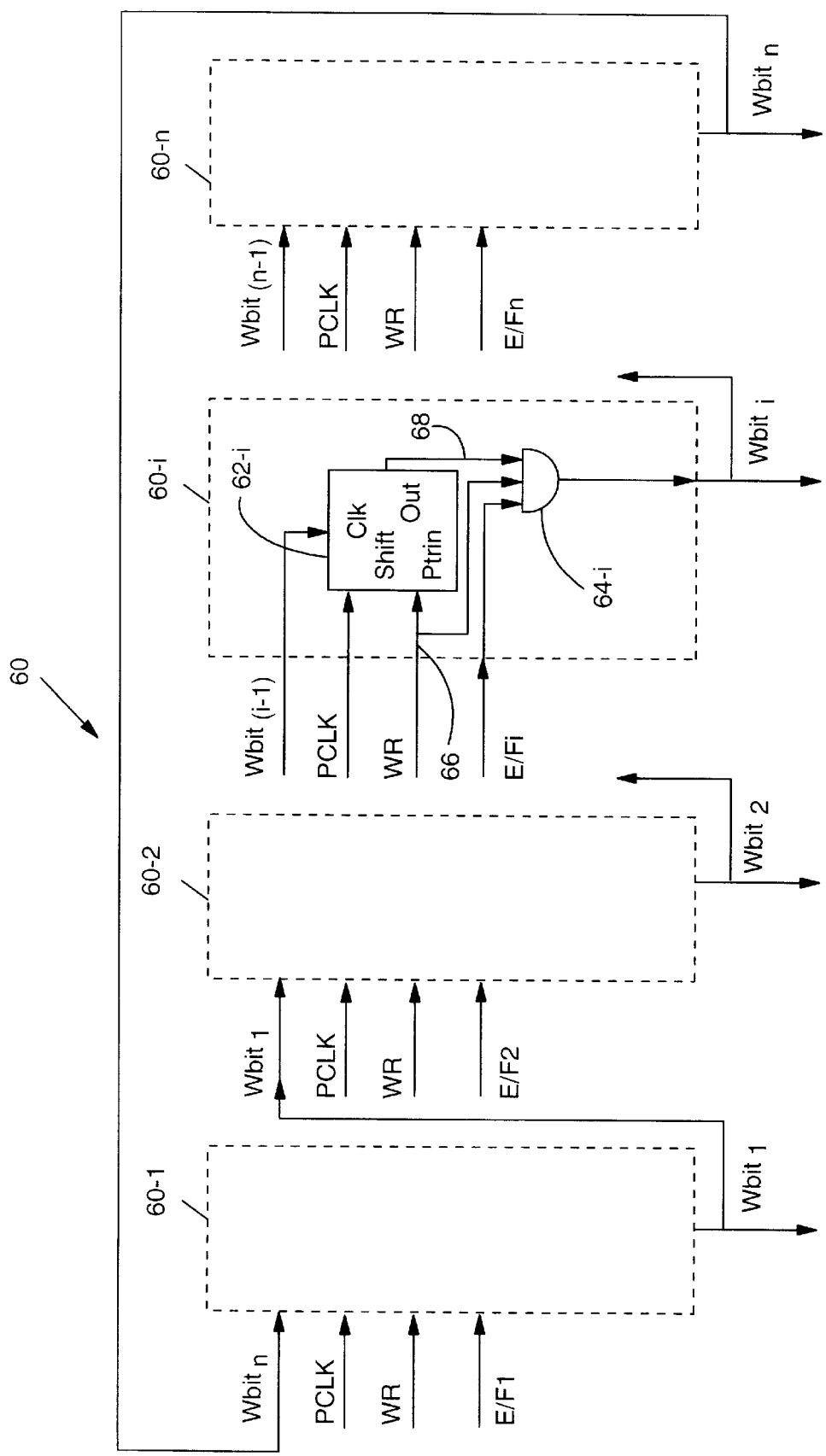
FIG. 6A is a block diagram of a parallel pointers generator as shown in FIG. 4.

FIG. 6A illustrates a preferred implementation of the parallel pointer generator 44 of FIG. 4. The generator 60 comprises n word pointing circuits (60-1 to 60-n), the output (Wbit1 to Wbitn) of each being connected to the corresponding row (1 to n) of the memory. The (n) word pointing circuits are ring connected, i.e. the output Wbit(i−1) of word pointing circuit (60-(i−1)) is connected to the input of the next word pointing circuit (60-i) and the output Wbit(n) of the last word pointing circuit (60-n) is connected to the input of the first word pointing circuit (60-1). Each word pointing circuit is clocked by the processor clock PCLK. The write control signal WR is also an input to each word pointing circuit. A filling indicator signal E/Fi is also input to a corresponding word pointing circuit (60-i). The processor clock PCLK, the write control signal WR and the output signal Wbit(i−1) enter a line pointer circuit (62-i) more detailed hereinafter with reference to FIG. 6C. The output of the line pointer circuit is one input of a three AND gate (64-i), the two other inputs being the filling indicator signal E/Fi and the write control signal WR. The output Wbit(i) of each AND gate is connected to the corresponding row in the memory.

At the initialization step, all line pointers except one are reset, whereas one is set in order to begin the loading of the first data word. The n filling indicator signals (E/F1 to E/Fn) are set to the "empty" value. Assuming the first line pointer (62-1) is set, when a write pulse WR occurs synchronously to PCLK, the output Wbit1 of the first AND gate (64-1) is asserted and the output value is simultaneously applied to the m cells within the first row of the memory. The (n−1) others Wbit signals are held to an inactive level. When the write pulse is ended, the first filling indicator signal E/F1 is set to the "full" value in response to the write pulse end. The first line pointer (62-1) is deasserted, while the second line pointer (62-2) is asserted only if the corresponding filling indicator signal E/F2 indicates the "empty" value. Each line pointer is therefore asserted one at a time under the condition that the corresponding filling indicator is set to an "empty" value. As was described for the first line pointer, the filling indicator of the current parallel pointer circuit is set to the "full" value in response to the write pulse end. Once the last parallel pointer circuit (60-n) has been asserted, the process loops back to the first pointer (60-1).

Concurrently with the filling of the second row, the serialization operation of the first row may be initiated. The process has been described with the first row being filled but it is not to be seen as a limitation as the process may begin at any row within the memory.

Figure 6B:
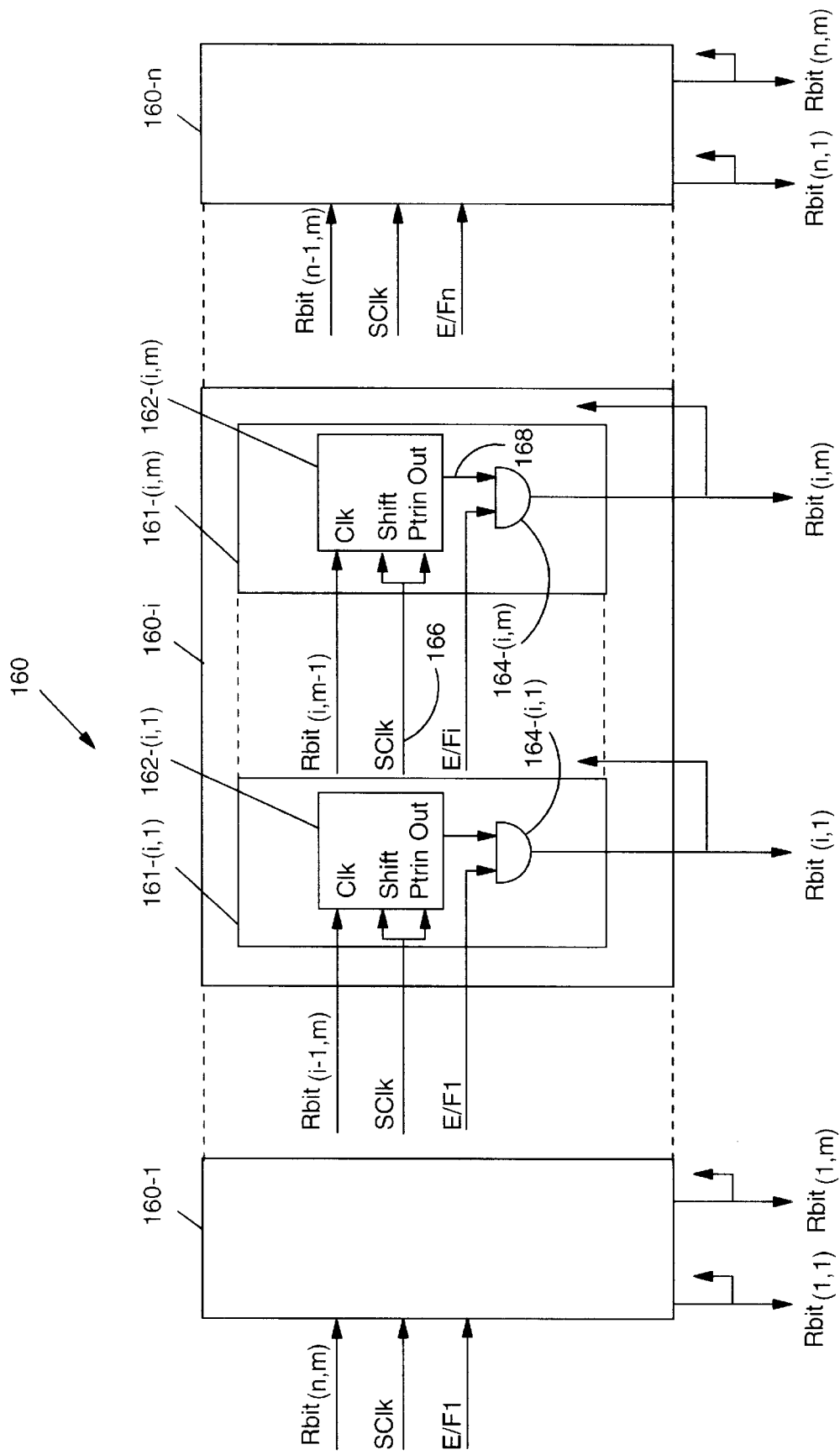
FIG. 6B is a block diagram of a serial pointers generator as shown in FIG. 4.

The assertion of the serial pointer signal Rbit is now explained with reference to FIG. 6B. FIG. 6B illustrates a preferred implementation of the serial pointer generator 46 of FIG. 4. The generator comprises (n) serial pointer blocks (160-1 to 160-n). Each block comprises (m) elementary cell pointing circuits (161-(i,1) to 161-(i,m)) which generate (m) serial pointer signals Rbit(i,j). Each serial pointer signal Rbit(i,j) is applied to a cell (i,j) within a corresponding row. Moreover the output of the last cell pointing circuit (161-(i,m)) within a serial pointer block (160-i) is also connected to the input of the first cell pointing circuit (161-(i+1)) of the next serial pointer block (160-(i+1)). The circuits are ring connected and therefore the output of the last cell pointing circuit 161-(n,m) of the last block (160-n) is connected to the input of the first cell pointing circuit (161-(1,1)) of the first block (160-1). One of the cell pointing circuit is now described.

The cell pointing circuit (161-(i,1)) comprises a bit pointer circuit (162-(i,m)) and a two-ways AND gate (164-(i,1)). The output of the bit pointer is connected to one input of the AND gate (164-(i,1)), the other input being connected to receive a corresponding filling indicator E/Fi. The bit pointer circuit is clocked by the serial clock SCLK. The output Rbit(i,1) of AND gate (164(i,1)) is connected to the input of the cell (i,1) which is located at the crossing of the ith row with the first column in the memory. Moreover, the output Rbit(i,1) is also connected to the input of the following cell pointing circuit (161(i,2)).

At the initialization step, all the serial pointers signals are inactive except one which points onto a first cell within a row of the memory. The serialization begins on a start order from the interface device 18 depending on the serial link protocol, and not discussed in this invention. If the pointed row has already been filled which means that the corresponding filling indicator E/F is set to the "full" value, the serialization is performed. The output signal Rbit is thereby asserted when a valid transition of the serial clock SCLK occurs. On the next valid transition of SCLK, the output signal Rbit of the active cell pointing circuit is deasserted while the output signal of the next cell pointing circuit is asserted, and the process continues until the output signal of the last cell pointing circuit within a serial pointer block is asserted.

After the active row is emptied, the serialization operation is stand-by or continues according to the values of the filling indicators of the next cell pointing circuits. If a next filling indicator is set to "full", then the process continues with the serialization of the corresponding row; otherwise in case all the filling indicators are set to "empty" the process stops until a new row is filled.

Although the above example has been described for a serial pointer generator organized as (n) serial pointer blocks connected in series, it is readily understood by the skilled man that the system could operate with various configurations of the memory.

Figure 6C:
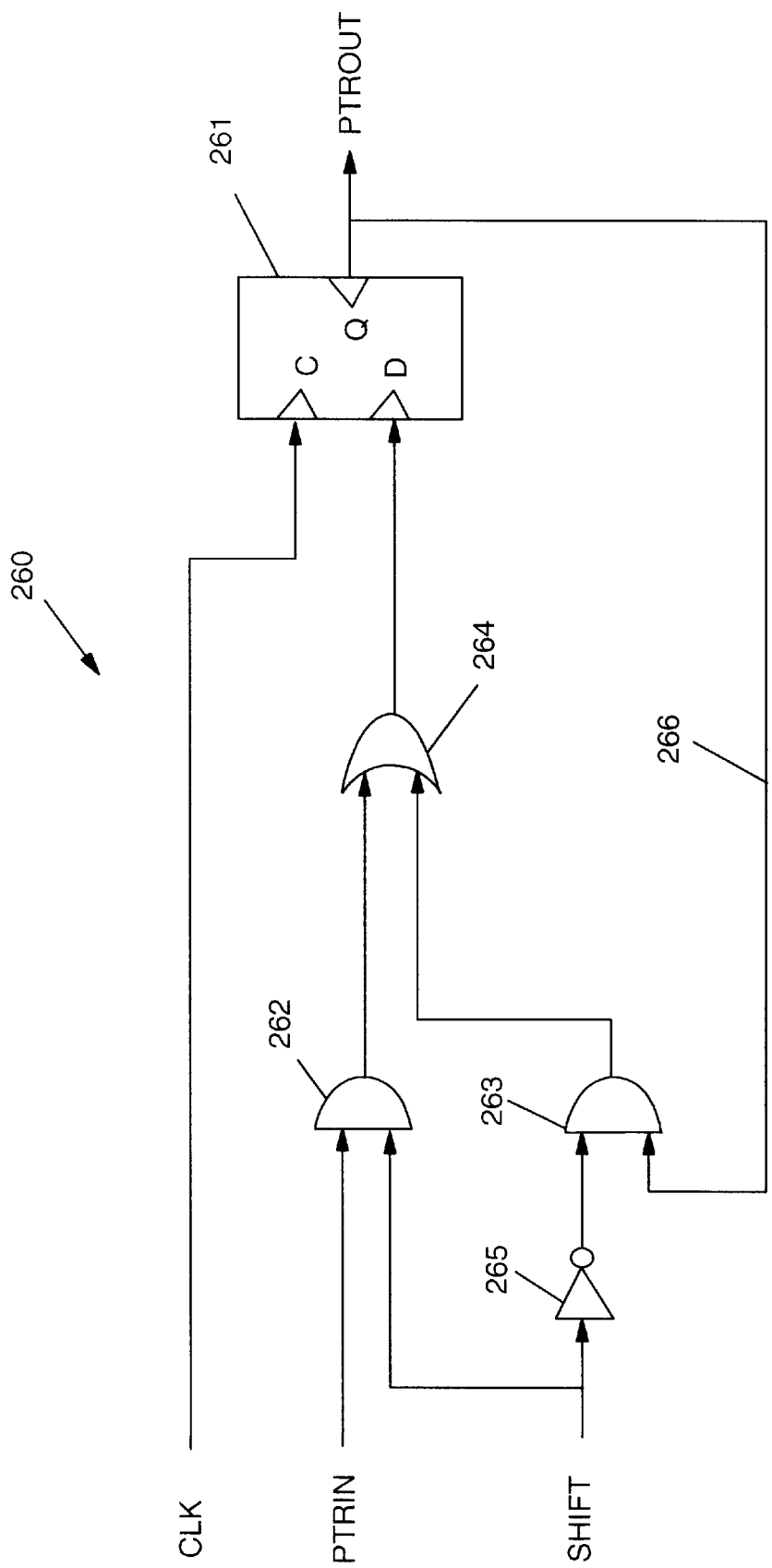
FIG. 6C is an implementation of a line or bit pointer for the circuits of FIGS. 6A and 6B, respectively.

Referring now to FIG. 6C, a circuit 260 which is used either as the line pointer circuit (62-i) or the bit pointer circuit (162-(i,j)) is shown. The circuit 260 comprises a conventional flip-flop latch 261, a first AND gate 262, a second AND gate 263, an OR gate 264 and an inverter 265. An input line SHIFT is connected to both the input of inverter 265 and one input of AND gate 262. Another input of AND gate 262 is connected to receive a pointer signal PTRin representing either the Wbit or the Rbit signal. The output of inverter 265 is connected to one input of the second AND gate 263, while the other input is connected to receive the output of latch 261 thru line 266. The output of AND gate 263 is connected to one input of OR gate 264. The other input of OR gate 264 is connected to receive the output of AND gate 262. The output of OR gate 264 is connected to a data input of latch 261. A clock input of latch 261 is connected to receive a clock signal CLK representing either the processor clock PCLK or the serial clock SCLK. The output of latch 261 is represented by the signal PTRout.

If the circuit is used as a line pointer, PTRin is the input exemplified by line 66 in FIG. 6A and PTRout is the output exemplified by line 68 while the SHIFT input is denoted by the write control signal WR. The clock signal CLK in this case is the processor clock PCLK.

If the circuit is used as a bit pointer, the PTRin and SHIFT inputs are connected together to form a unique input which is exemplified by line 166 in FIG. 6B. PTRout in this case is exemplified by line 168, and the clock signal CLK is the serial clock SCLK.

The SHIFT input is asserted and deasserted in synchronism with CLK. When the SHIFT input is inactive, the current value in the latch is held via the feedback line 266. When the SHIFT input becomes active, a new PTRin value is stored in the latch and maintained via the feedback line.

Figure 7A:
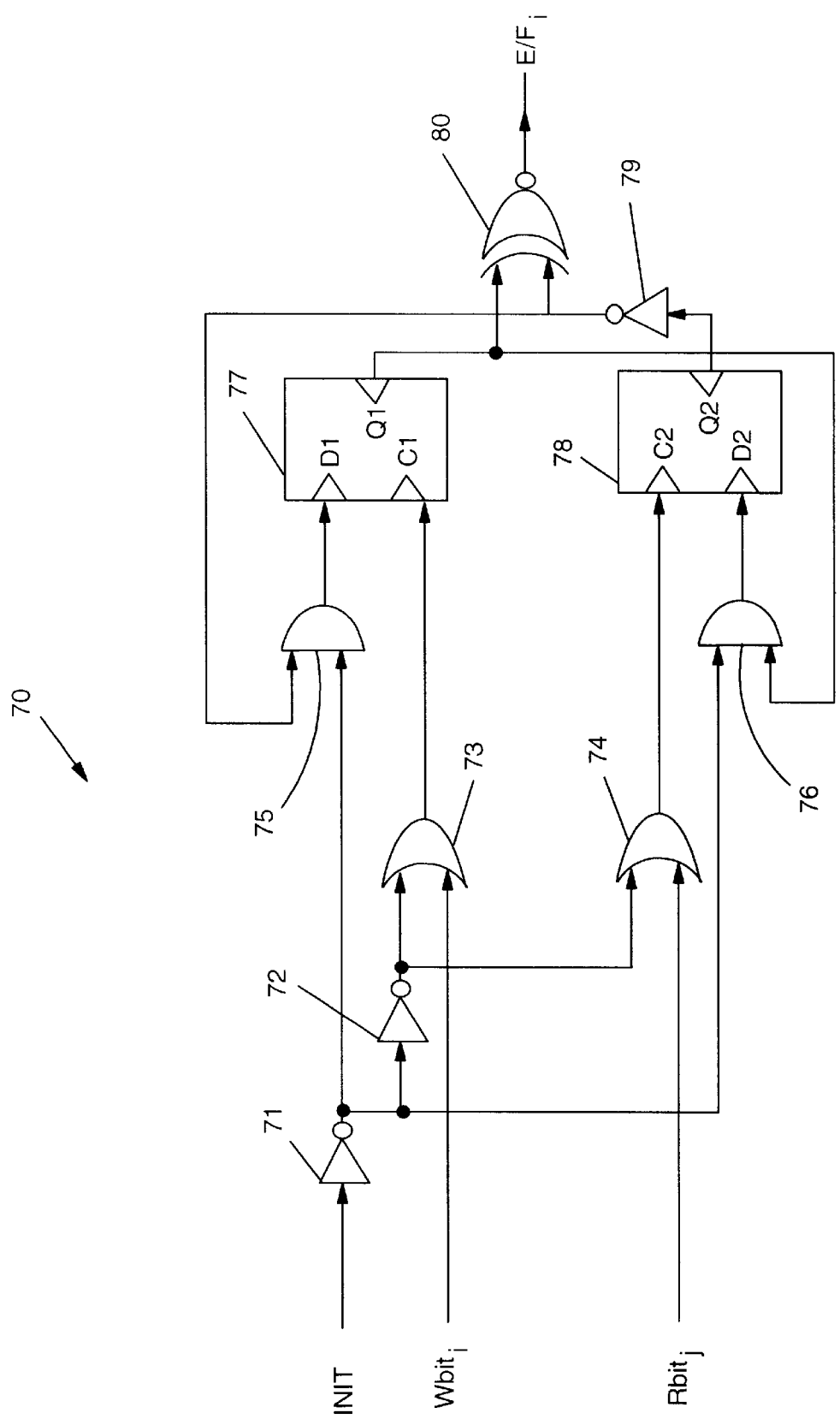
FIG. 7A is an implementation of a filling indicator circuit used and shown in FIG. 4.

FIG. 7A is a preferred implementation of a filling indicator circuit 70, generating the "empty/full" signal E/F as used by the parallel pointer generator and the serial pointer generator. The circuit 70 comprises first and second inverters 71, 72; first and second OR gates 73, 74; first and second AND gates 75, 76; first and second conventional D flip-flop latches 77, 78; a third inverter 79; and a XORnot gate 80.

Figure 7B:
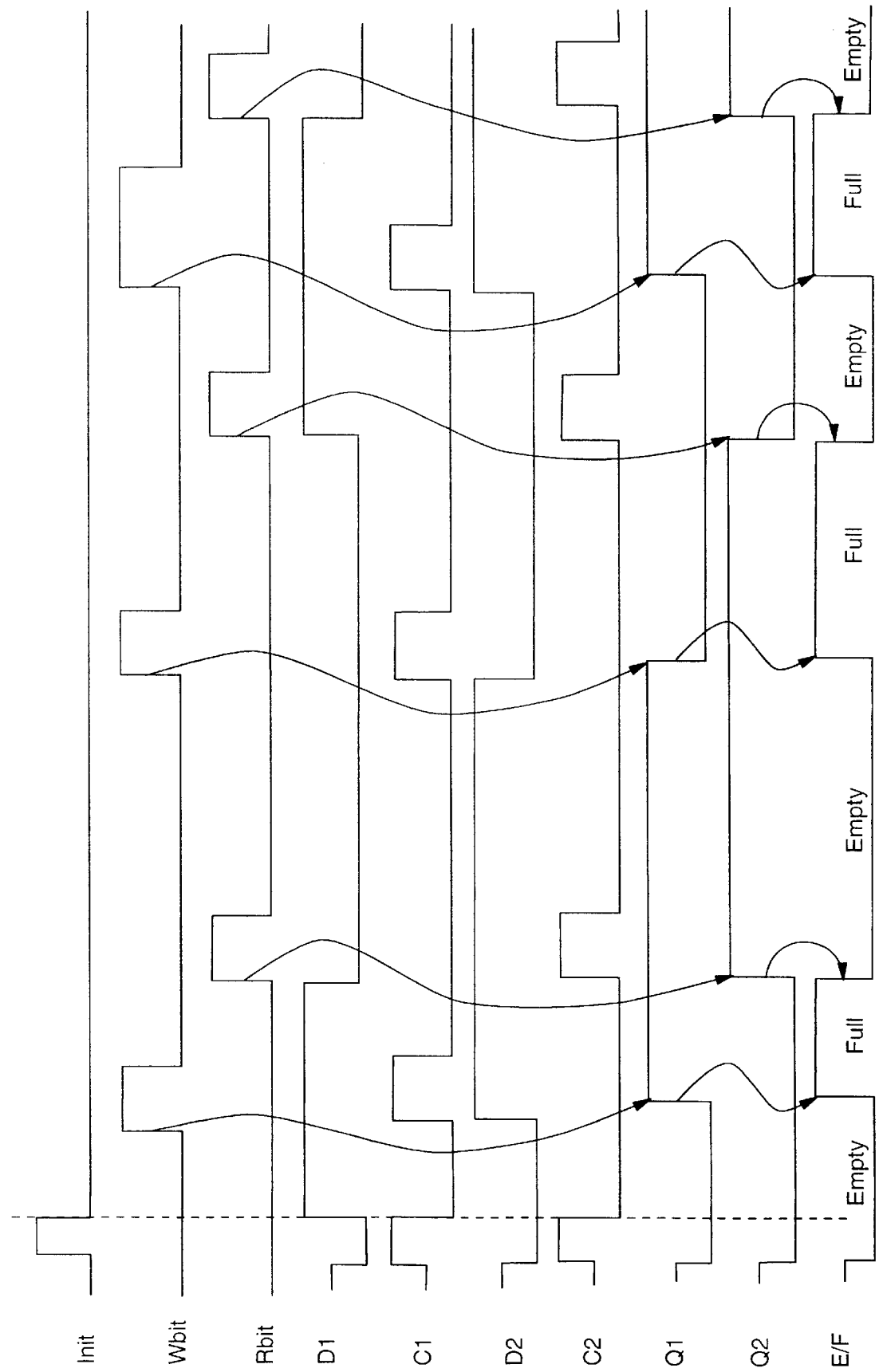
FIG. 7B is a timing diagram of the signals used in the circuit of FIG. 7A.

The operation of circuit 70 is illustrated by the timing diagram of FIG. 7B now to be described. After the initialization step represented by the vertical dashed line on FIG. 7B, the output E/F of circuit 70 is set to a logic level indicating an "empty" value, the data input D1 of latch 77 is set to a "1" logic value, and data input D2, clock inputs C1 and C2 are set to a '0' logic value. At a first occurrence of a parallel pointer signal (line Wbit), the logic value of Q1 is toggled and the output E/Fi is toggled to the "full" value. When a serial pointer signal (line Rbit) is asserted, the logic value of Q2 is toggled thereby the output E/F is toggled to the "empty" value.

In a preferred embodiment the processor clock is a 33 MHz clock and the serial clock may vary from almost DC up to 33 MHz. The strings of data words transmitted are 32 bits long divided into 4 bytes each comprised of 8 bits of data. The memory is preferably organized as a matrix of three rows by 32 columns.

While the invention has been particularly shown and described with reference to a preferred embodiment thereof, it will be understood by those skilled in the art that various changes in form and details may be made without departing from the spirit and scope of the invention.

We claim:

1. An asynchronous parallel to serial conversion circuit for converting parallel bits operating at a parallel clock rate (PCLK) and representing a plurality of words into serial bits operating at a serial clock rate (SCLK), said circuit comprising:
   a) storing means comprising a plurality (n) of word locations for temporarily storing the plurality of words at the parallel clock rate (PCLK), each of said plurality of word locations having a plurality (m) of cells for storing one bit; and
   b) serialization means connected to the storing means for converting the parallel bits into serial bits at the serial clock rate (SCLK) in the storing means comprising:
      i) Parallel pointing means connected to the storing means for pointing to said plurality of word locations synchronously using the parallel clock rate (PCLK);

ii) serial pointing means connected to the storing means for pointing to the plurality of cells synchronously using the serial clock rate (SCLK); and iii) filling indicator means connected to the parallel pointing means and to the serial pointing means for generating a status signal (E/F) indicating the status "Empty" or "Full" of said storing means such that said serial pointing means is responsive to said status signal for successively pointing said plurality of cells when said status is "Full".

2. The circuit of claim 1 wherein the serial pointing means further comprises a plurality (nm) of ring connected cell pointing circuits responsive to said filling indicator means such that each of said cell pointing circuits is connected to a corresponding cell within the storing means.

3. The circuit of claim 1 wherein the serial clock rate (SCLK) is asynchronous to the parallel clock rate (PCLK).

4. The circuit of claim 1 wherein the ratio of the parallel/serial clock rates equals 1.

5. The circuit of claim 1 in an interface device including a processor bus operating at the processor clock rate (PCLK); a serial link operating at the serial clock rate (SCLK), and wherein the words are in the form of data words.

6. The circuit of claim 1 for use in an interface device connecting two asynchronous serial links operating at identical clock rates.

7. An asynchronous data conversion circuit for converting parallel bits representing a plurality of words into serial bits and vice versa, comprising:

a) a processor generating or receiving the parallel bits, and including a processor clock operating at a parallel bit clock rate (PCLK);

b) a serial data link providing or receiving serial bits and operating at a serial clock rate (SCLK);

c) a storage means coupled to the processor and the serial link;

d) pointing means coupled to the storage means and responsive to the PCLK and SCLK signals; the pointing means supplying the storage means with pointer control signals for controlling the storing and outputting the parallel and serial bits in the storing means to the processor and the serial link, respectively; and e) filling means providing the pointing means with status signals for use in supplying the pointer controls signals to the storage means.

8. The asynchronous data conversion circuit of claim 7 wherein the pointing means comprises a parallel pointer and a serial pointer.

9. The asynchronous data conversion circuit of claim 7 wherein the pointer control signals comprise a Wbit signal and a Rbit signal.

10. The asynchronous data conversion circuit of claim 7 further comprising means for supplying the pointer control signals to the filling means.

11. The asynchronous data conversion circuit of claim 7 wherein the status signals indicate the storage means as "empty" or "full".

12. In a network handling system for converting parallel bits representing a plurality of words into serial bits and vice versa and including a processor means; a storage means; pointing means, filling means and a serial link, a method for asynchronous data conversion circuit of the parallel bits and the serial bits and vice versa, comprising the steps of:

a) generating or receiving the parallel bits at a parallel bit clock rate (PCLK);

b) providing or receiving serial bits at a serial clock rate (SCLK);

c) storing the parallel or serial bits in the storage means;

d) supplying the storage means with control signals using pointing means for controlling the storing and outputting of the parallel and serial bits in the storing means in/to the processor and the serial link, respectively; and e) using filling means to provide status signals to the pointing means in supplying the controls signals to the storage means.

13. The method of claim 12 further comprising the steps of:

a) generating a first control signal Wbit using a parallel pointing means; and b) generating a second control signal Rbit using a serial pointing means.

14. An asynchronous parallel to serial conversion circuit for converting parallel bits operating at a parallel clock rate (PCLK) and representing a plurality of words into serial bits operating at a serial clock rate (SCLK), said circuit comprising:

a) storing means comprising a plurality (n) of word locations for temporarily storing the plurality of words at the parallel clock rate (PCLK), each of said plurality of word locations having a plurality (m) of cells for storing one bit; and b) serialization means connected to the storing means for converting the parallel bits into serial bits at the serial clock rate (SCLK) comprising:

i) parallel pointing means connected to the storing means for pointing to said plurality of word locations synchronously using the parallel clock rate (PCLK);

ii) serial pointing means connected to the storing means for pointing to the plurality of cells synchronously using the serial clock rate (SCLK), the serial pointing means comprising a plurality (nm) of ring connected cell pointing circuits responsive to said filling indicator means such that each of said cell pointing circuits is connected to a corresponding cell within the storing means wherein the serial pointing means further comprises a plurality (nm) of ring connected cell pointing circuits responsive to said filling indicator means such that each of said cell pointing circuits is connected to a corresponding cell within the storing means; and iii) filling indicator means connected to the parallel pointing means and to the serial pointing means for generating a status signal (E/F) indicating the status "Empty" or "Full" of said storing means such that said serial pointing means is responsive to said status signal for successively pointing said plurality of cells when said status is "Full".

15. The circuit of claim 14 wherein the filling indicator means further comprises a plurality (n) of filling indicator circuits for generating a plurality (n) of status signals (E/F1 to E/Fn), such that a group of (m) successive cell pointing circuits is responsive to a corresponding status signal.

16. The circuit of claim 14 wherein the parallel pointing means further comprises a plurality (n) of ring connected word pointing circuits, each of said word pointing circuits being connected to a corresponding word location within the plurality (n) of word locations, such that each of said word pointing circuits is responsive to a corresponding status signal.

17. The circuit of claim 14 wherein each cell within the plurality (m) of cells further comprises:

a) latching means clocked by the parallel clock rate signal (PCLK) for holding a bit (DATIN) on an assertion of a parallel pointer signal (WBit) output from said parallel pointing means; and b) output means responsive to said latching means for outputting said held bit as a data out bit (DATOUT) on an assertion of a serial pointer signal (RBit) output from said serial pointing means.

18. In a network handling system for converting parallel bits representing a plurality of words into serial bits and vice versa and including a processor means; a storage means; pointing means, filling means and a serial link, a method for asynchronous data conversion circuit of the parallel bits and the serial bits and vice versa, comprising the steps of:

a) generating or receiving the parallel bits at a parallel bit clock rate (PCLK);

b) providing or receiving serial bits at a serial clock rate (SCLK);

c) storing the parallel or serial bits in the storage means;

d) supplying the storage means with control signals using pointing means for controlling the storing and outputting of the parallel and serial bits in the storing means in/to the processor and the serial link, respectively;

e) using filling means to provide status signals to the pointing means in supplying the controls signals to the storage means;

f) generating a first control signal Wbit using a parallel pointing means; and g) generating a second control signal Rbit using a serial pointing means.

19. The method of claim 18 further comprising the step of:

a) supplying the control signals Wbit and Rbit to the filling means.

20. The method of claim 18 further comprising the step of:

a) using the Wbit signal to store bits by row in the storage means when a row is designated "empty" by the status signal.

21. The method of claim 18 further comprising the step of:

a) using the Rbit signal to output bits by row in the storage means when a row is designated "full" by the status signal.

22. An asynchronous serial to parallel conversion circuit for converting serial bits operating a serial clock rate (SCLK) into parallel bits operating at a parallel clock rate (PCLK) and representing a plurality of words, said circuit comprising:

a) storing means comprising a plurality (n) of word locations for temporarily storing the serial bits at the serial clock rate (SCLK), each of the plurality of word locations having a plurality (m) of cells for storing one bit; and b) deserialization means connected to the storing means for converting the serial bits into parallel bits at the parallel clock rate (PCLK) in the storing means comprising:

i) parallel-pointing means connected to the storing means for pointing to said plurality of word locations synchronously using the parallel clock rate (PCLK);

ii) serial pointing means connected to the storing means for pointing to the plurality of cells synchronously using the serial clock rate (SCLK); and iii) filling indicator means connected to the parallel pointing means and to the serial pointing means for generating a status signal (E/F) indicating the status "Empty" or "Full" of said storing means such that said parallel pointing means is responsive to said status signal for successively pointing said plurality of word locations when said status is "Full".

23. An asynchronous serial to parallel conversion circuit for converting serial bits operating a serial clock rate (SCLK) into parallel bits operating at a parallel clock rate (PCLK) and representing a plurality of words, said circuit comprising:

a) storing means comprising a plurality (n) of word locations for temporarily storing the serial bits at the serial clock rate (SCLK), each of the plurality of word locations having a plurality (m) of cells for storing one bit; and b) deserialization means connected to the storing means for converting the serial bits into parallel bits at the parallel clock rate (PCLK) comprising:

i) parallel pointing means connected to the storing means for pointing to said plurality of word locations synchronously using the parallel clock rate (PCLK);

ii) serial pointing means connected to the storing means for pointing to the plurality of cells synchronously using the serial clock rate (SCLK), the serial pointing means comprising a plurality (nm) of ring connected cell pointing circuits responsive to said filling indicator means such that each of said cell pointing circuits is connected to a corresponding cell within the storing means wherein the serial pointing means further comprises a plurality (nm) of ring connected cell pointing circuits responsive to said filling indicator means such that each of said cell pointing circuits is connected to a corresponding cell within the storing means; and iii) filling indicator means connected to the parallel pointing means and to the serial pointing means for generating a status signal (E/F) indicating the status "Empty" or "Full" of said storing means such that said parallel pointing means is responsive to said status signal for successively pointing said plurality of word locations when said status is "Full".

24. In a network handling system for converting parallel bits representing a plurality of words into serial bits and vice versa and including a processor means; a storage means; pointing means, filling means and a serial link, a method for asynchronous data conversion circuit of the parallel bits and the serial bits and vice versa, comprising the steps of:

a) generating or receiving the parallel bits at a parallel bit clock rate (PCLK);

b) generating a first control signal Wbit using a parallel pointing means c) providing or receiving serial bits at a serial clock rate (SCLK);

d) generating a second control signal Rbit using a serial pointing means e) storing the parallel or serial bits in the storage means;

f) supplying a filling means and the storage means with the Wbit and Rbit control signals;

g) using pointing means for controlling the storing and outputting of the parallel and serial bits in/to the processor and the serial link, respectively; and h) using the filling means to provide status signals to the pointing means in supplying the controls signals to the storage means.

* * * * *